United States Patent
Rusinko, Jr. et al.

(10) Patent No.: US 7,494,616 B2
(45) Date of Patent: Feb. 24, 2009

(54) CONTAINER FOR EVAPORATION OF METAL AND METHOD TO MANUFACTURE THEREOF

(75) Inventors: David Michael Rusinko, Jr., Lakewood, OH (US); Ajit Sane, Medina, OH (US); Gary Zayas, Brunswick, OH (US)

(73) Assignee: Momentive Performance Materials Inc., Albany, NY (US)

( * ) Notice: Subject to any disclaimer, the term of this patent is extended or adjusted under 35 U.S.C. 154(b) by 410 days.

(21) Appl. No.: 11/266,796

(22) Filed: Nov. 4, 2005

(65) Prior Publication Data

US 2007/0110412 A1    May 17, 2007

(51) Int. Cl.
*B01D 7/00* (2006.01)

(52) U.S. Cl. .............. 266/275; 266/280; 266/286; 501/96.3

(58) Field of Classification Search ............. 266/275, 266/280, 286; 501/96.3, 96.4
See application file for complete search history.

(56) References Cited

U.S. PATENT DOCUMENTS

| | | | |
|---|---|---|---|
| 3,514,575 A | 5/1970 | Hall et al. | |
| 3,515,852 A | 6/1970 | Matheson et al. | |
| 3,636,305 A | 1/1972 | Passmore | |
| 3,915,900 A | 10/1975 | Reinmuth et al. | |
| 4,029,466 A | 6/1977 | Ishii et al. | |
| 4,089,643 A | 5/1978 | Jerabek et al. | |
| 4,268,314 A | 5/1981 | Montgomery | |
| 4,446,357 A | 5/1984 | Barshter | |
| 4,528,120 A | 7/1985 | Hunold et al. | |
| 5,395,180 A | 3/1995 | Mariner | |
| 5,604,164 A | 2/1997 | Montgomery et al. | |
| 5,908,795 A | 6/1999 | Nishio et al. | |
| 6,085,025 A | 7/2000 | Seifert | |
| 6,120,286 A | 9/2000 | Goetz | |
| 6,645,572 B2 | 11/2003 | Seifert | |
| 7,319,079 B2 * | 1/2008 | Rusinko et al. | 501/96.3 |

FOREIGN PATENT DOCUMENTS

| | | |
|---|---|---|
| JP | 2001-240958 | 4/2001 |
| JP | 2005-135594 | 5/2005 |
| WO | WO 2004/057052 | 7/2004 |
| WO | WO 2005/049881 | 6/2005 |

\* cited by examiner

*Primary Examiner*—Scott Kastler
(74) *Attorney, Agent, or Firm*—Dominick G. Vicari (57) ABSTRACT

A refractory container for evaporating metals, having improved useful life and corrosion resistance properties, the evaporation surface of the container having a plurality of grooves formed at the bottom surface. The grooves have either a depth of at least 1.2 mm, a width of at least 1.75 mm, or an interval spacing of at least 2.2 mm between adjacent grooves (or centers of adjacent grooves), and combinations thereof.

42 Claims, 6 Drawing Sheets

CONTAINER FOR EVAPORATION OF METAL AND METHOD TO MANUFACTURE THEREOF

FIELD OF THE INVENTION

The present invention relates to an improved container for the vacuum evaporation of metal.

BACKGROUND OF THE INVENTION

Vacuum deposition is a common method for coating metals such as aluminum, copper, zinc, and tin onto various substrates of metal, glass, and plastic. The metal is typically vaporized by means of electric resistance heating in a metallic or ceramic container or vessel generally referred to in the art as a "boat" or a metallization boat. The boat is connected to a source of electrical power within an evacuated chamber and heated to a controlled operating temperature sufficient to cause a metal charge placed in contact with the boat to vaporize.

In the vacuum metallization process, the metal melt in a metallization boat is heated to a very high temperature, in many instances to a temperature higher than typically seen in casting operations, 1200° C. and above. This means that the metal melt will be much more aggressive and behave as a corrosive acid, lowering the life of the metallization boats. Additionally, when the operation is carried out with repetitive heating, cooling, and exposure to molten metals during that span, the life of the boats is further reduced.

One important factor to longer boat life is the wettability of the slag build-up in the cavity of the boat. After a few hours in operation, a slag begins to build up around the edge of the metal puddle in the boat. The slag is the by-product of the reaction of the molten metal with the refractory boat, and is typically non-wetting to the metallizing metal. It inhibits the spreading of the metal puddle, thus increases the operating temperature and further reduces the useful life of the boat. Improved wetting of the boat and/or slag surface is believed to be an important factor in increasing the average life of metallization boats.

Another factor impacting boat life is the resistance to corrosion by the molten aluminum. During metallization, the molten aluminum corrodes the surface of the boat, typically resulting in deep grooves running from the anterior to the posterior of the boat and penetrating into the boat's depth. These grooves over time, effect the spreading of the aluminum melt, affecting the deposition uniformity on the metallized substrate. Additionally, the grooves can cause the spattering of the liquid aluminum due to excessive accumulation of the aluminum in the grooves. Aluminum spatter causes holes in the metallized substrate. At the point where there is non-uniformity in the metallized substrate or there are holes in the boats due to metal spatter, the boats are typically replaced. Therefore, minimizing the depth of grooves, or slowing the formation of grooves over the evaporation surface can lead to longer useful boat life.

PCT Publication No. WO 2005/049881A1 discloses a metallization boat with improved wettability, which indirectly can lead to longer boat life. The boat has a plurality of grooves having a depth of 0.03 to 1 mm, a length of more than 1 mm, a width of 0.1 to 1.5 mm, and a distance between the grooves of less than 2.0 mm.

Figure 23:
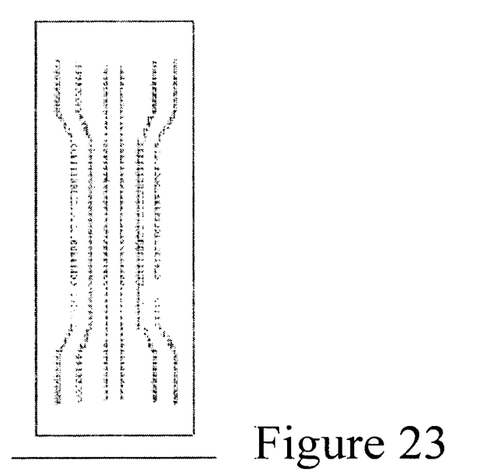
FIG. 23 is a top view showing a metallization boat in the prior art.

FIG. 23 is a top view showing a metallization boat in the prior art (as discussed in U.S. Pat. No. 6,645,572) having multiple grooves, with a number of grooves with a lengthwise orientation as the direction of conduction of the boat, and the rest of the grooves having most of their length running parallel to the direction of conduction of the boat.

There is still a need to further increase the useful life of metallization boats by mitigating the severity and pattern of groove formation over the metallization surface. Applicants have found that increasing the depth, and/or the width, and/or the spacing between the grooves in metallization boats leads to less severe grooving over the metallization surface, and a more uniform grooving pattern, while maintaining the improved wettability, thus extending the useful service life of the boats over the prior art.

BRIEF SUMMARY OF THE INVENTION

The invention relates to a refractory container for evaporating metals having an evaporation surface in contact with molten metal with a direction of conduction parallel to a length axis of the refractory boat and a plurality of grooves in the evaporation surface, with the grooves each having at least one of a depth of at least 1.2 mm, a width of at least 1.75 mm, and an interval spacing of at least 2.2 mm, and with at least two of the plurality of grooves having at least a portion of length at an angle of 10 to 170° to the direction of conduction of the refractory boat.

The invention further relates to a method to extend service life in refractory boats, by creating a plurality of grooves in the evaporation surface in contact with molten metal, for the grooves to have at least one of a depth of at least 1.2 mm, a width of at least 1.75 mm, and an interval spacing of at least 2.2 mm, and for at least two of the plurality of grooves to have a portion of length to position at an angle of 10 to 170° to the direction of conduction of the refractory boat.

DETAILED DESCRIPTION OF THE INVENTION

As used herein, the terms "first," "second," and the like do not denote any order or importance, but rather are used to distinguish one element from another, and the terms "the", "a" and "an" do not denote a limitation of quantity, but rather denote the presence of at least one of the referenced item. Furthermore, all ranges disclosed herein are inclusive of the endpoints and are independently combinable.

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, the term "metallization boat" may be used interchangeably with "refractory boat," "evaporation boat," "evaporation vessel," "evaporator boat," or simply "vessel" or "boat," referring to a heating source for metallization.

As used herein, the direction of conduction means the longitudinal direction parallel to the major (length) axis of a metallization boat.

A. Composition of the Boat of the Invention: As to the composition of the metallization boat of the invention, in one embodiment, the metallization boat comprises an electrically conductive component such as titanium diboride, zirconium diboride, titanium nitride, silicon carbide, chromium carbide, and mixtures thereof; a non-conductive component such as boron nitride, aluminum nitride, silicon nitride, nitride of a rare earth metal compound, alumina, silica, boric oxide, boron oxynitride, oxide of a rare earth metal compound, oxide of an alkaline earth metal, and mixtures thereof. The boron nitride is either hexagonal boron nitride or amorphous boron nitride, or its mixtures. The composition of mixed materials has a density of at least about 90% of theoretical density (% TD). Such compositions are described in various patents and publications including U.S. Pat. Nos. 3,544,486; 3,915,900; 4,528,120; 5,604,164; and US Patent Publication Number 2005-0065015, which references are expressly incorporated herein by reference.

In one embodiment of the invention, the boat comprises mixed materials of 10-60 wt. % BN, 0 to 60 wt. % of at least one of a nitride of the elements Al, Si, Ti, Fe, Co, Ni and mixtures thereof; and 30-70 wt. % of at least one electronically conductive material selected from the group of borides of Ti, Zr, Al, Cr and mixtures thereof, and carbides of Si, Ti, and Cr. In one example, the boat comprises 10-60 wt. % BN, 0 to 60 wt. % of at least AlN or SiN, and 30 to 70 wt. % of at least titanium diboride, zirconium boride, aluminum boride, chromium boride, silicon carbide, titanium carbide, and chromium carbide.

In one embodiment, the boat consists essentially of a refractory boride, predominantly titanium diboride, one or more refractory nitrides, predominantly, boron nitride and/or aluminum nitride, and about 0.10 to 25 wt. % of at least one of a metal compound, a transition metal compound, an alkali metal compound, a rare earth metal compound of a boride, an oxide, a carbide, a nitride and mixtures thereof.

In one embodiment, the rare earth metal compound consists essentially of yttrium oxide. In a second embodiment, the alkali metal compound consists essentially of calcium oxide. In a third embodiment of the invention, the metal compound consists essentially of aluminum oxide. In a fourth embodiment, the transition metal compound consists essentially of iron boride. In a fifth embodiment the boat comprises: a) titanium diboride and boron nitride; or titanium diboride, boron nitride and aluminum nitride; b) a metal selected from molybdenum, tungsten, tantalum and niobium; and c) an oxide such as CaO, MgO, $Al_2O_3$, $TiO_3$, compounds of these oxides and rare earth metal oxides such as $Y_2O_3$, YAG($Al_5Y_3O_{12}$), YAP($AlYO_3$), and YAM($Al_2Y_4O_7$). In one example, the container boat consists essentially of 45-65 wt. % of boron nitride; 35-65 wt. % of titanium diboride; and 0.10 to 10 wt. % of a rare earth metal compound such as an oxide, a carbide, a nitride, and a mixture thereof. In another example, the container boat further contains up to 10 wt. % aluminum nitride, or at least one of a calcium oxide, aluminum oxide, magnesium oxide, and titanium dioxide.

B. Forming a Densified Body: In one embodiment, the refractory boat is prepared by molding the mixture comprising the various components to form a green body having a TD of at least 50%, and then die pressing the body. In one embodiment, the green body heated to a densification temperature of at least about 1400° C. and at a pressure of about 100 to 300 Mpa for a TD of at least 90%. In one embodiment wherein the pressure is applied onto all sides of the green body, e.g., in an autoclave, for a densified body having uniform density distribution and uniform isotropic microstructure. In another embodiment, the green body is isostatically hot pressed at a temperature of 1800 to 2200° C. and a pressure of 1 to 100 Mpa. In yet another embodiment, the hot pressing is done after uniaxial pressing or cold isostatic pressing of 0.5 to 200 Mpa.

In one embodiment, the green body is densified through pressureless sintering at a temperature above 1000° C. In another embodiment, the green body is formed in a process such as slip casting, tape casting, fugitive-mold casting, or centrifugal casting.

C. Forming Metallization Boat having Patterned Top Surface: After the sintering process, the densified body is formed into a suitable shape of a boat by various means including a manual means using tools known in the art such as band saws, grinders, and the like, or alternate means such as Electro Discharge Machining (EDM), Electro Discharge Grinding (EDG), laser, plasma, ultrasonic machining, sand-blasting, and water jet, etc. In one embodiment, the machining is done according to a predetermined computer controlled pattern ("CNC") to maintain the desired configuration depending on the final metallization application, i.e., the dimensions of the boat, the formation of the cavity in the top surface, and the patterning of the top surface of the boat.

In one example of a boat, the densified body is machined into a boat having a length of 50 to 200 mm, width of 10 to 35 mm, and a depth or thickness of 8 to 30 mm with a cavity of 45 to 120 mm, a width of 7 to 32 mm, and a cavity depth of 0.5 to 4 mm. In another embodiment, the boat has dimensions of 41.275 mm (1⅝"), a width of 14.2875 mm (9/16"), and a depth of 26.9875 mm (1 1/16"). The cavity of this boat has dimensions of 34.925 mm (1.375") by 11.1125 mm (0.4375 inch) by 3.175 mm (0.125 inch).

Figure 13:
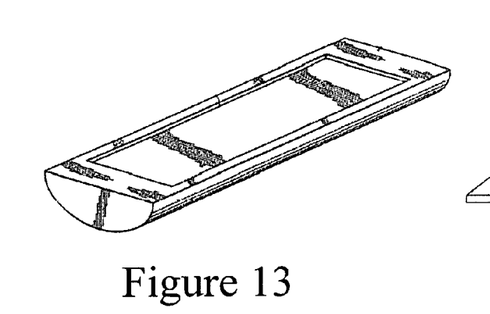
FIGS. 13-22 are perspective views showing different shapes of the boat of the invention.
Figure 14:
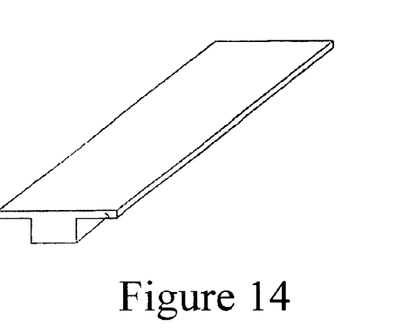
Figures 21, 22:
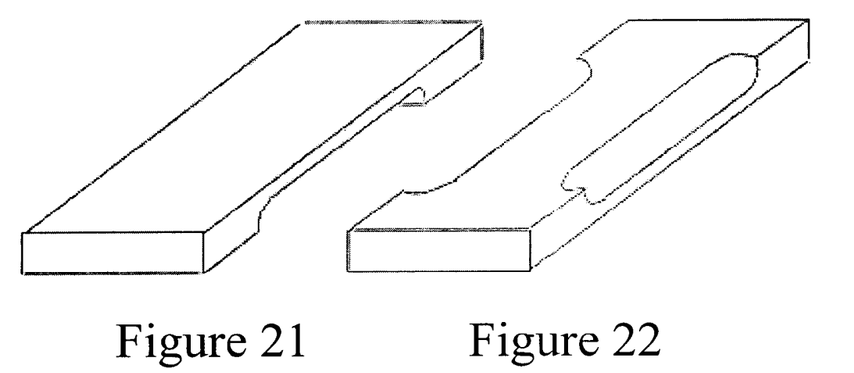

Depending on the applications, the boat of the invention may be of various shapes and forms as illustrated in the figures. In one embodiment, the boat is of a rectangular shape and with a rectangular cross-section as shown in FIGS. 1-2, 15 and 17. In another embodiment, the boat has an elliptical cross-section as shown in FIG. 13, an inverted triangle cross-section as shown in FIG. 16, a T-shape for a cross-section as in FIG. 14, an inverted U or hat-shape cross-section as in FIG. 18, an inverted isosceles trapezoid shape for a cross-section as in FIG. 19, and an isosceles trapezoid shape for a cross section in FIG. 20. In another embodiment as shown in FIG. 21, the boat has a rectangular cross-section for the two ends but a mid-section with an inverse isosceles trapezoid shape for increased cooling surface area. In another embodiment as shown in FIG. 22 for increased cooling surface area purpose, the boat has a rectangular cross-section for the two ends but a middle section having an isosceles trapezoid shape for a cross-section.

In one embodiment of the invention, the boat of the invention comprises a smooth surface onto which grooves are formed. In another embodiment, the boat has at least one cavity in the top surface, with the grooves being formed on the surface of the cavity. In another embodiment, the boat has a plurality of cavities in the surface for simultaneous vapor-deposition of two or more low melting metals, for example. The grooves of the invention may be formed on at least one or multiple cavities. The cavity may be of various shapes, forms, and dimensions as illustrated in FIGS. 13, 15, 16, 17, and 18. For boats with multiple cavities, the cavities may be of the same or different shapes, forms, and dimensions.

Figure 15:
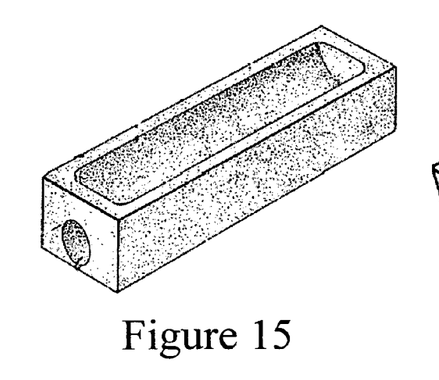
Figure 16:
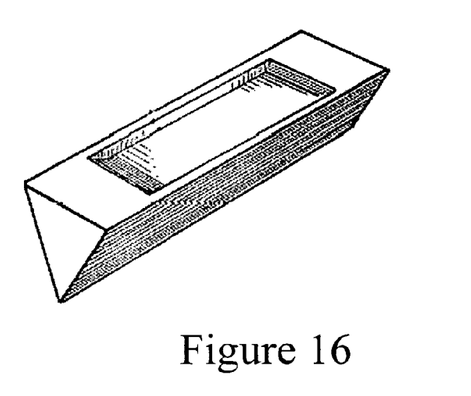
Figure 17:
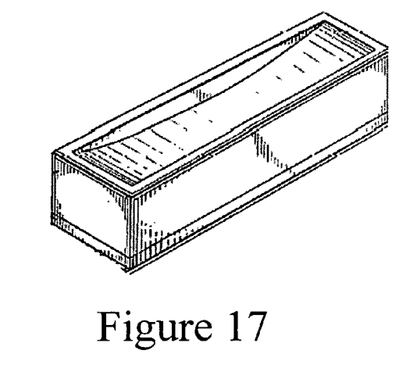
Figure 18:
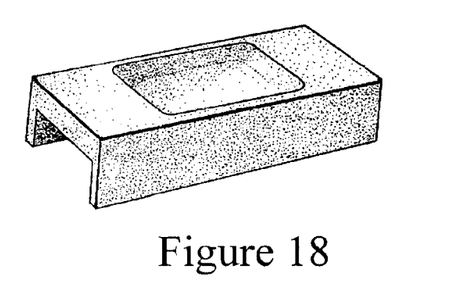
Figures 19, 20:
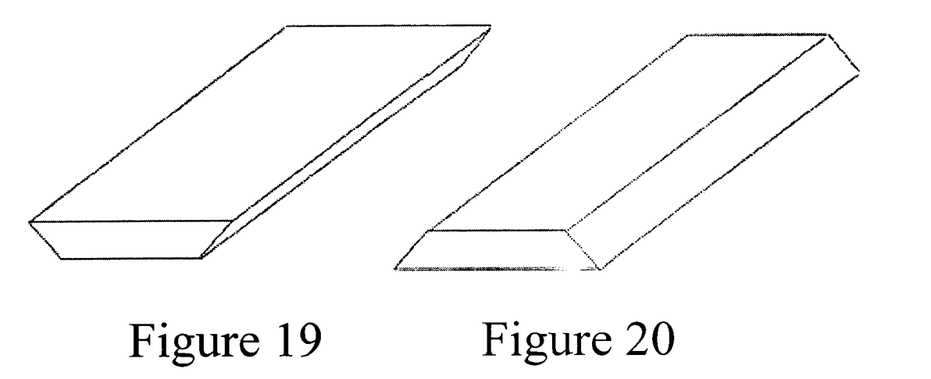

In one embodiment, the cavity has an elliptical shape for its cross section as in FIG. 15. In another embodiment, the cavity has an inverted isosceles trapezoid shape as shown in FIG. 16. In yet another embodiment, the cavity has a bow shape with a maximum depth in the center of the boat cavity as illustrated in FIG. 17. In a fourth embodiment, the cavity is of equal shallow depth as in FIG. 13. In a fifth embodiment, the cavity is relatively deep relative to the thickness of the boat as shown in FIG. 18.

In one embodiment, the cavity and/or top surface of the boat (for the evaporation of molten metal) is coated with a layer which functions as a wetting enhancement coating and/or a corrosion resistant coating. The coating can be applied by brush painting, brush coating, spraying, rolling, dipping, and the like. The coating may comprises an electrically conductive component composition as disclosed in U.S. Pat. No. 6,645,572, or a non-electrically conductive composition, selected from compounds of an oxide such as CaO, MgO, $SiO_2$, $ZrO_2$, $B_2O_3$, $Al_2O_3$, $TiO_2$, hafnium oxide, compounds of these oxides and rare earth metal oxides such as $Y_2O_3$, YAG($Al_5Y_3O_{12}$), YAP($AlYO_3$), and YAM($Al_2Y_4O_7$), or a nitride such as calcium nitride, TiN, BN, AlN, $Si_3N_4$, and mixtures thereof, or one of a metal alkoxide, a silicon alkoxide, an alumina solution, and a silica solution. A non-electrically conductive composition is meant a composition that has a resistivity at room temperature of greater than 1500 micro-ohm-cm, and a resistivity of greater than 4500 micro-ohm-cm at operating temperature.

In one embodiment, the coating is a non-electrically conductive composition comprising at least one of an oxide, a nitride, a boride, a carbide, a silicide and mixtures thereof. In another embodiment, the coating comprises a suspension of a fine powder of at least one of BN, AlN, iron boride, $TiB_2$, TiC, ZrC, HfC, VC, NbC, TaC, $Cr_3C_2$, $Mo_2C$, WC in water, acetone, alumina sol, and the like, including compounds derivatives and mixtures thereof. In a third embodiment, the non-electrically coating is a BN paint commercially available from sources such as General Electric Company and Zyp Coatings, Inc. In a fourth embodiment, the electrically conducting coating comprises a paste comprising $TiB_2$ powder in glycerol as a binder. In a fifth embodiment, $TiB_2$ powder is sprinkled onto the surface of the boat, and then irradiated by a YAG laser.

In another embodiment, the coating is an oxide thin film layer selected from metal alkoxides and silicon alkoxides. In a second embodiment, the coating layer comprises alumina sol (bohmite alumina colloidal solution) or silica sol (e.g., tetra-ethoxy silane TEOS or tetramethoxy silane TMOS). In a fourth embodiment, the coating is a mixture of TiC and alumina sol.

Figure 10:
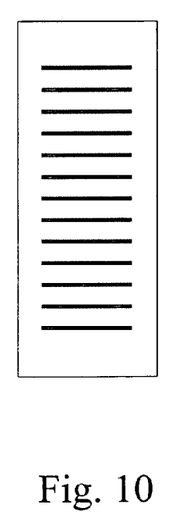
Figure 11:
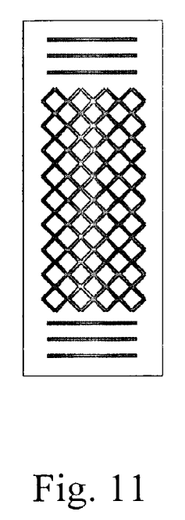
Figure 12:
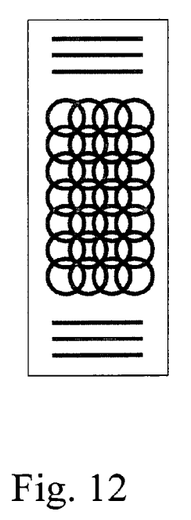

The boat of the invention comprises a plurality of grooves formed on the boat surface or boat cavity as illustrated in FIGS. 1-12. The grooves may be stand-alone as separate grooves (e.g., parallel groves in FIGS. 5, 6, 7, 9, and 10), they may be interconnected (see FIGS. 1, 2, and 8), or a combination of stand-alone and interconnected grooves on the surface (FIGS. 11 and 12).

As defined herein, a "groove" is a channel running across one dimension of the cavity (width or length), e.g., a line or a curve, or a self-terminating channel on the cavity surface with random geometry or having the shape of a circle (FIG. 12), square, rectangle, triangle, diamond (FIG. 11), ellipse, etc. The grooves are formed on the boat surface or the surface of the cavity by known automatic or manual mechanical means such as using grinders, drills, via Electro Discharge Machining (EDM), Electro Discharge Grinding (EDG), laser, plasma, ultrasonic machining, sand-blasting, and water jet, etc.

Figure 5:
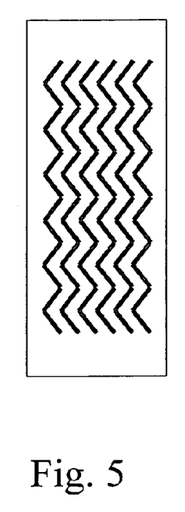
FIGS. 5-12 are top views showing different embodiments of the boat of the invention.
Figure 6:
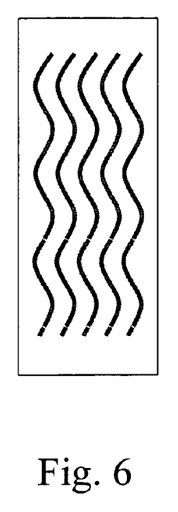

In one embodiment, the grooves are circular in shape as shown in FIG. 12. In another embodiment, the grooves are of random geometry as shown in FIGS. 5, 6, 8, and 9. In a third embodiment, the grooves are in the form of straight lines as shown in FIGS. 1-4, 7 and 10. In a fourth embodiment, the grooves are in the form of random lines as shown in FIG. 6. In a fifth embodiment, the grooves are formed in a direction not parallel to the conduction direction (i.e., not aligned with the major axis of the boat). In a sixth embodiment, at least 50% of the grooves intersect with one another. In a seventh embodiment, there is no intersection of the grooves as illustrated in FIGS. 5 and 6.

Figure 7:
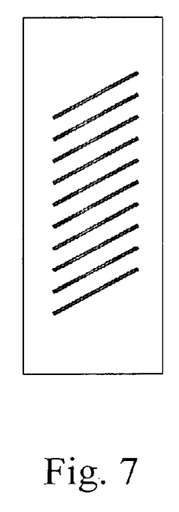

In one embodiment, the grooves having at least a portion of the length at an angle of 10 to 170 degrees to the conduction direction (the length axis of the boat) as illustrated in FIG. 7. By at least "a portion of the length" is meant at least 20% of the length of the groove length. In another embodiment, at least 40% of the length of the groove length is at an angle of 10 to 170 degrees to the conduction direction.

Figure 8:
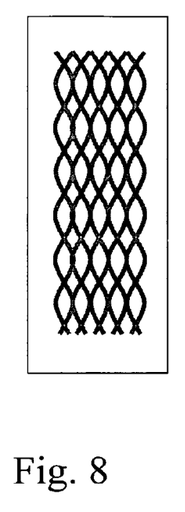
Figure 9:
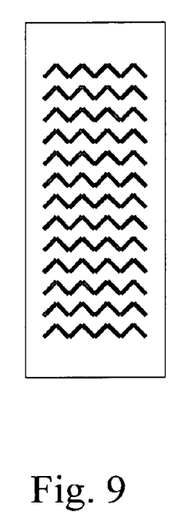

In another embodiment, the grooves are from 20 degrees to 160 degrees to the conduction direction as illustrated in FIG. 10. In a third embodiment, at least 10% of the grooves are at an angle of 10 to 170 degrees to the conduction direction as illustrated in FIG. 8. In a fourth embodiment, at least 50% of the grooves are at an angle of 10 to 170 degrees to the conduction direction as illustrated in FIG. 8.

In one embodiment, the grooves are interconnected as illustrated in FIG. 8. In another embodiment, at least 25% of the grooves are interconnected as illustrated in FIGS. 11-12.

In one embodiment, only the grooves are coated or filled with a wetting enhancement and/or corrosion resistant coating layer as previously described for coating a boat surface in contact with molten metal, e.g., an electrically conductive composition, or a non-electrically conductive composition. A non-electrically conductive composition is meant a composition that has a resistivity at room temperature of greater than 1500 μ-Ωcm, and a resistivity of greater than 4500 μ-Ω-cm at operating temperature.

Examples include BN, AlN, $TiB_2$, TiC, ZrC, HfC, VC, NbC, TaC, $Cr_3C_2$, $Mo_2C$, WC, derivatives and mixtures thereof, metal alkoxides, silicon alkoxides, and mixtures thereof, to be applied onto the grooves by brush painting, brush coating, spraying, rolling, dipping, etc.

Applicants have found that by minimizing the depth of grooves, or controlling formation of grooves over the evaporation surface, boat life can be surprisingly extended, i.e., in specifying for the grooves each to have at least one of: a) a depth of at least 1.2 mm; b) a width of at least 1.75 mm, and c) an interval spacing of at least 2.2 mm.

In one embodiment, the boat of the invention is characterized as having grooves with a depth of at least 1.2 mm and a width of at least 1.75 mm. In another embodiment, the grooves have a depth ranging from 1.5 to 5 mm. In a second embodiment, a depth of at least 1.5 mm. In a third embodiment, a width of at least 2 mm.

In one embodiment, the boat of the invention has a depth of 1.0 mm, a width of 1 mm, and an interval spacing of 2.5 mm. In another embodiment, the boat is characterized by having adjacent grooves being spaced at least 1 mm (0.039") apart (for grooves in the form of random or straight lines) as illustrated in FIGS. 1-4. In another embodiment, the grooves of depth 1.5 mm are spaced at least 2 mm (0.079") apart. In another embodiment, the grooves of width 1 mm are spaced at least 2.5 mm apart. In yet another embodiment, the centers of adjacent grooves having 1.2 mm depth with a circular, triangular, square, rectangular, or elliptical shape are at last 1 mm apart.

In one embodiment, the grooves are of uneven depth to promote the wettability of the molten metals, e.g., the grooves in the center of the cavity of the boat being deeper than the grooves near the edges of the boat. In one embodiment, the grooves have a depth difference of at least 50%, i.e., the deepest grooves are at least 50% deeper than the shallowest grooves.

Examples are provided herein to illustrate the invention but are not intended to limit the scope of the invention.

EXAMPLES 1-4

In all examples, evaporator boats commercially available from GE Advanced Ceramics of Strongsville, Ohio, under the trade name "VaporStar" were used. The boats were machined for an overall dimensions of 30 mm wide, 10 mm thick, and 150 mm long. Grooves of various dimensions were machined on the surface of the boats such that the grooves were at 45 degrees to the longitudinal axis of the boat, creating an interconnected pattern. The grooves were machined using a sandblasting technique, for the following dimensions for the grooves.

TABLE 1

| Example | Initial boat thickness (mm) | Groove Width (mm) | Groove Depth (mm) | Groove Spacing (mm) |
|---|---|---|---|---|
| SM-1 | 10.2 | 0.5 | 0.1 | 1.0 |
| SM-2 | 10.2 | 1.0 | 0.6 | 2.0 |
| SM-3 | 10.0 | 2.0 | 1.5 | 4.0 |
| SM-4 | 10.2 | 1.0 | 0.9 | 5.0 |

Figure 1:
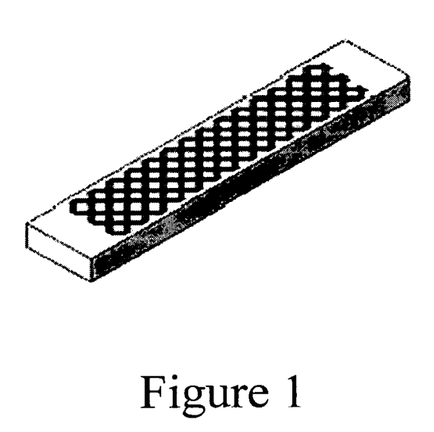
FIG. 1 is a perspective view of one embodiment of the metallization boat of the invention.
Figure 2:
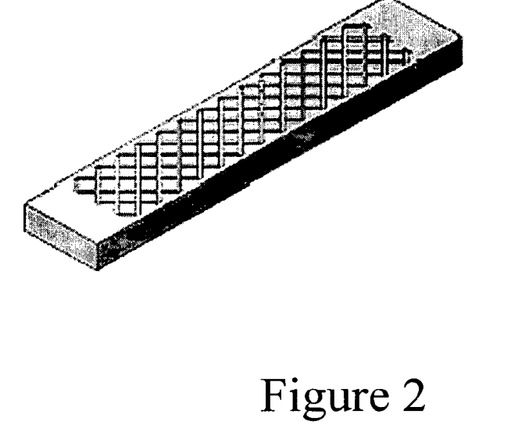
FIG. 2 is a perspective view showing a second embodiment of the invention with intersecting grooves being placed relatively far apart.
Figure 3:
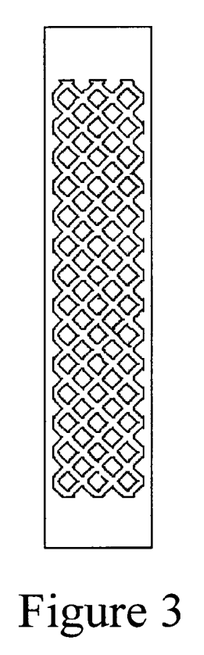
FIGS. 3 and 4 are top evaporation surface views of the metallization boats of FIGS. 1 and 2, respectively.
Figure 4:
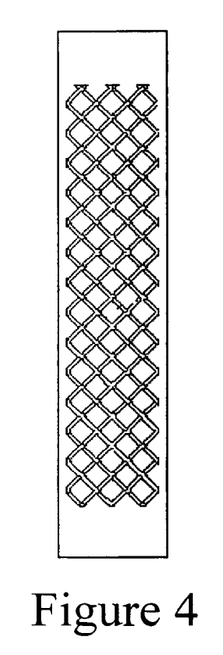
Figure 24:
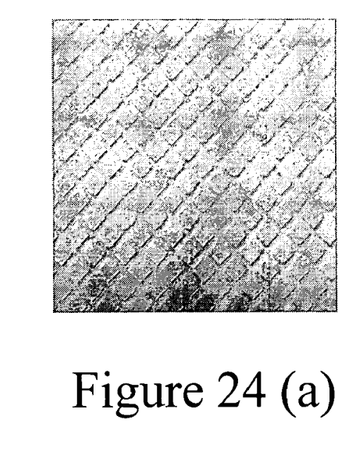
FIGS. 24a, 25a, 26a, and 27a are photographs showing the groove patterns in comparative boats and the boats of the present invention.
FIGS. 24b, 25b, 26b, and 27b are photographs showing the groove patterns in comparative boats and the boats of the present invention, after 8 hours of metallization.
Figure 25:
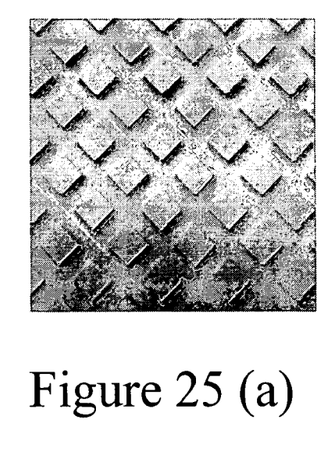
Figure 26:
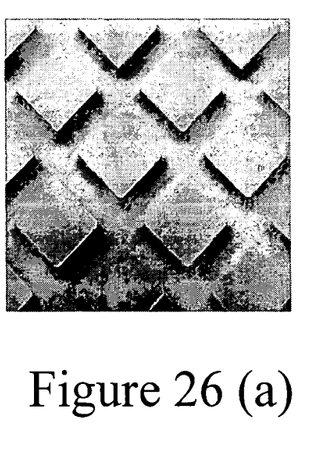
Figure 27:
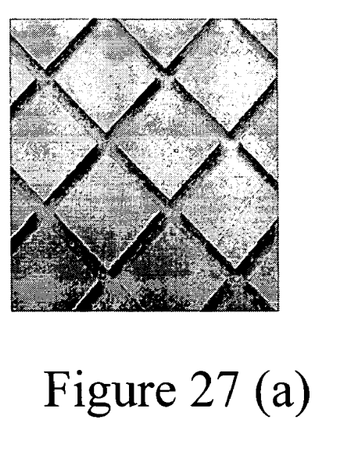

FIGS. 1-2 are perspective views and FIGS. 3-4 are top views of the boats of the invention in Examples 3-4. Examples 1 and 2 are comparative examples illustrating the grooved boats of the prior art. FIGS. 24(*a*)-27(*a*) are photographs of the top views of the grooved sections of the boats in Examples 1-4 before metallization.

The evaporation boats made from the Examples were tested in a vacuum chamber at $\sim 1 \times 10^{-4}$ millibar. The boats were heated by a direct passage of current and brought to a temperature of 1500° C. through direct heating. Aluminum for metallization was supplied continuously via an aluminum wire fed near the middle area of the grooved pattern. The wire feed was at 9.5 grams per minute for eight 1-hour intervals, for a total time of metallization of 8 hours. Between each 1-hour metallization interval, the boats were cooled and lightly brushed using a soft-plastic bristle brush. The brushing was to replicate the typical cooling, venting, and cleaning of boats during substrate roll changes in actual applications. During metallization, the boat temperature was controlled to maintain an even spreading and evaporation of molten aluminum over the metallization surface of the boat.

As the test progresses, the aluminum spreading was stable and consistent for all of the boats. It was noted that the aluminum caused more severe length-wise grooving in the boats of comparative examples 1-2, as compared to less severe and more uniform grooving in examples 3-4 of the invention. After 8 hours of metallization, the boats were photographed and the deepest point of the groove was measured using a drop-gage.

In Table 2, the "Min. thickness after run." is the thickness of the boat at the deepest point of grooving after the 8-hour metallization period. The "Max. wear depth after run" is the depth of wear starting from the base of the initially machined grooves, i.e. the initial minimum thickness minus the thickness after metallization. The "Wear depth as % of ini. thickness" is computed as the percentage of "Max wear depth after run" over the initial minimum thickness.

TABLE 2

| Example | Initial boat thickness | Groove width | Groove depth | Groove spacing | Initial min. thickness | Min. thickness after run | Max. wear depth after run | Wear depth as % of initial thickness |
|---|---|---|---|---|---|---|---|---|
| SM-1 | 10.2 | 0.5 | 0.1 | 1.0 | 10.1 | 5.0 | 5.1 | 49% |
| SM-2 | 10.2 | 1.0 | 0.6 | 2.0 | 9.7 | 4.4 | 5.3 | 46% |
| SM-3 | 10.0 | 2.0 | 1.5 | 4.0 | 8.5 | 4.8 | 3.7 | 22% |
| SM-4 | 10.2 | 1.0 | 0.9 | 5.0 | 9.3 | 5.3 | 4.0 | 30% |

FIGS. 24(*b*)-27(*b*) are photographs of the top views of the boats in Examples 1-4 after 8 hours of metallization. As seen in the pictures, the boats of the invention held up quite well with less-severe and more uniform grooving leading to additional life left in the boats—expected to be useable for at least 4 more hours. The metallization boats with the groove dimensions of the prior art corroded more quickly as seen in the picture, with some of the grooves penetrating deeply and extensively in a length-wise direction of the boats.

EXAMPLES 5-8

In these examples, evaporator boats commercially available from GE Advanced Ceramics of Strongsville, Ohio, under the trade name "VaporStar" were also used. The boats were machined for an overall dimensions of 10 mm×40 mm×132 mm.

Figure 29A:
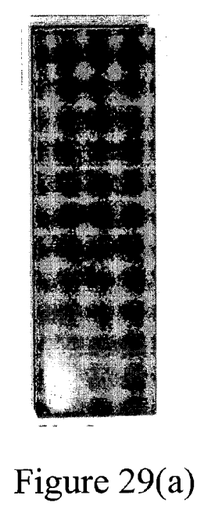
Figure 31A:
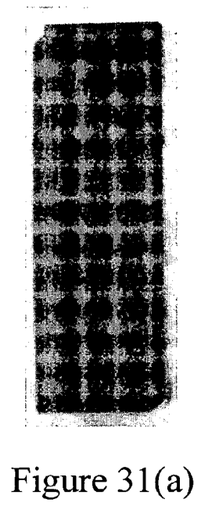

The top surface of the boats in FIGS. 29(*a*), 30(*a*), and 31(*a*) were wet-sanded with 320 grit sand paper. The top surface of the boat of FIG. 28(*a*) was ground with a standard grinding wheel to generate a 0.25 mm deep ground cavity. Grooves of about 1 mm wide, 1 mm deep, and about 4 mm apart were manually machined in the top surface of the boat of FIG. 30(*a*) using a Dremel tool to create intersecting patterns of an approximate 45° angle to the electrical conduction direction. Grooves were manually machined in the top surface of the boat of FIG. 31(a) using a Dremel tool to create a groove pattern of the prior art, having longitudinal grooves of about 1 mm deep, 1 mm wide, and 3 mm apart.

Figure 28A:
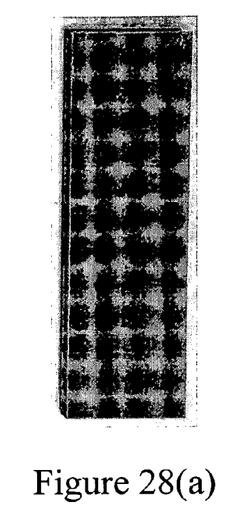
FIGS. 28a, 29a, 30a, 31a are photographs showing the patterns in comparative boats (with longitudinal grooves and without grooves) and the boat of the present invention prior to metallization.
Figure 28B:
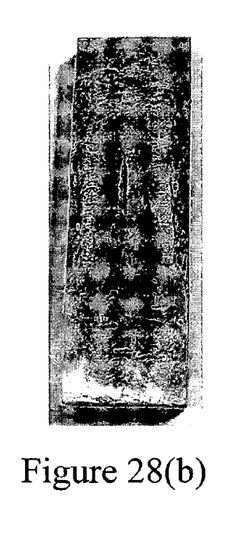
FIGS. 28b, 29b, 30b, 31b are photographs of the boats of FIGS. 28a-31a, respectively, after 5 hours of metallization.
Figure 29B:
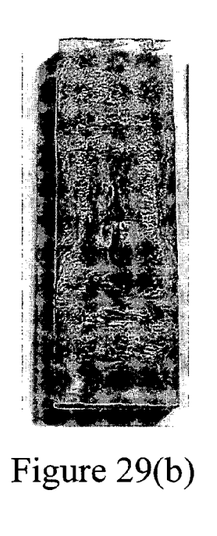
Figure 30A:
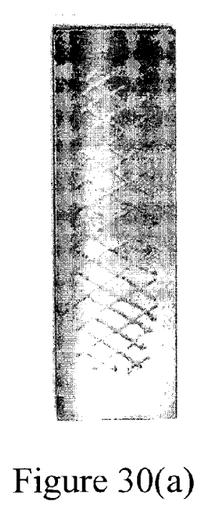
Figure 30B:
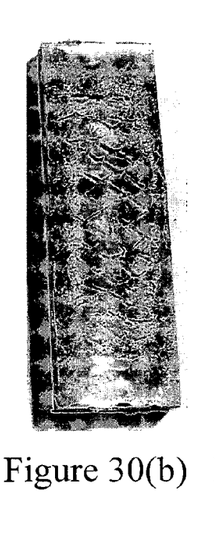
Figure 31B:
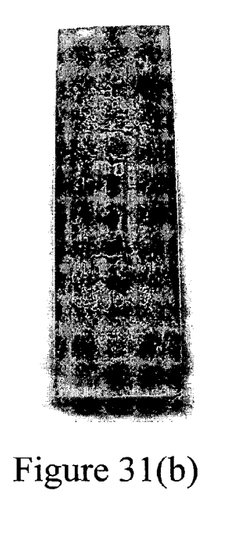

The boats were tested under the same aluminum metallization condition similar to that of Examples 1-4 but for only 5 hours. As shown in FIG. 31(b), deep grooves formed along the length of the prior-art boat that had longitudinal grooves. Shown in FIGS. 28(b) and 29(b), deep grooves were also formed in the prior-art boats having a ground cavity or a smooth surface at the start. FIG. 30(b) shows that the grooves in the boat of the present invention (crisscrossed pattern and wide interval spacing) are not as deep and are more uniformly spread out over the surface of the boat, tending to follow the crisscrossed pattern. Furthermore, it was observed that the puddle shape during 5 hours of use remained more uniformly spread out over the surface of boat in FIG. 30(b) of the present invention, as compared to the boats of the prior art (FIGS. 28b, 29b, and 31b).

EXAMPLE 9

An evaporator boat commercially available from GE Advanced Ceramics of Strongsville, Ohio, under the trade name "VaporStar" was used. The boat was machined for an overall dimensions of 10.2 mm thickness×40 mm×132 mm with grooves having dimensions identical to the boat of Example 4, i.e., 1 mm thickness, 0.9 depth, and 5 mm spacing. The boat surface, including the evaporation surface in contact with molten metal and the grooves, was coated with a boron nitride (BN) paint. BN coating paint is commercially available from sources including General Electric Company of Strongsville, Ohio and Zyp Coatings, Inc. of Oak Ridge, Tenn. (e.g., a water based BN from GE, or BN Lubricoat® Blue from Zyp).

The boat was tested under the same aluminum metallization condition similar to that of Example 4. The boat held up quite well with minimal and more uniform grooving even compared with the boat of Example 4 after 8 hours. The test continued for a total of 17 hours, showing that the coating substantially extended the life of the grooved boat.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A refractory container for evaporating metals having:
    an electrically conductive compound that is selected from the group consisting of titanium diboride, zirconium diboride, titanium nitride, silicon carbide, chromium carbide, compounds, derivatives, and mixtures thereof;
    a non-electrically-conductive compound that is selected from the group consisting of yttrium oxide and calcium oxide;
    an evaporation surface in contact with molten metal;
    the refractory container having a direction of conduction parallel to a length axis of the refractory container;
    the refractory container having a plurality of grooves in the evaporation surface;
    the refractory container is characterized in that the plurality of grooves each having at least one of:
        a depth of at least 1.2 mm;
        a width of at least 1.75 mm; and
        an interval spacing of at least 2.2 mm; and
    at least two of the grooves have at least 20% of length at an angle of 10 to 170 degrees to the direction of electrical conduction of the refractory container.

2. The refractory container of claim 1, wherein at least two of the plurality of grooves are interconnected.

3. The refractory container of claim 1, wherein the plurality of grooves are intervally spaced at least 2.5 mm apart.

4. The refractory container of claim 1, wherein the plurality of grooves have a depth of at least 1.5 mm.

5. The refractory container of claim 1, wherein the plurality of grooves have a width of at least 2 mm.

6. The refractory container of claim 1, wherein the plurality of grooves have a depth of at least 0.10 mm, a width of at least 0.5 mm, and an interval spacing of at least 2.2 mm.

7. The refractory container of claim 1, wherein the plurality of grooves have a depth of at least 0.10 mm, a width of at least 1.75 mm, and an interval spacing of at least 1 mm.

8. The refractory container of claim 1, wherein the plurality of grooves have a depth of at least 1.2 mm, a width of at least 1 mm, and an interval spacing of at least 1 mm.

9. The refractory container of claim 1, wherein the plurality of grooves have a width of at least 1 mm, a depth or at least 0.9 mm, and an interval spacing of at least 2.2 mm.

10. The refractory container of claim 1, wherein the plurality of grooves comprise at least two interconnected grooves, where each of the at least two interconnected grooves are at an angle of 10 to 170 degree to the direction of conduction of the refractory container.

11. The refractory container of claim 1, wherein at least a portion of the evaporation surface in contact with molten metal is coated with at least one layer comprising at least one of a wetting enhancement layer and a corrosion resistant layer.

12. The refractory container of claim 11, wherein the at least one layer comprises at least one of an oxide, a nitride, a boride, a carbide, a silicide, and derivatives thereof.

13. The refractory container of claim 12, wherein the at least one layer is a non-electrically conductive composition comprising at least one of a boride, a carbide, a nitride, an oxide, and a silicide.

14. The refractory container of claim 13, wherein the at least one layer comprises at least one of a transition metal, refractory metal, rare-earth metal, or alkali-earth metal nitride.

15. The refractory container of claim 11, wherein the layer comprises at least one layer comprises at least one of CaO, MgO, $SiO_2$, $ZrO_2$, $B_2O_3$, $Al_2O_3$, $TiO_2$, hafnium oxide, $Y_2O_3$, YAG($Al_5Y_3O_{12}$), YAP($AlYO_3$), YAM($Al_{12}Y_4O_7$), calcium nitride, TiN, BN AlN, $Si_3N_4$, a metal alkoxide, a silicon alkoxide, an alumina solution, a silica solution, and derivatives thereof.

16. The refractory container of claim 11, wherein the at least one layer comprises at least one of BN, AlN, iron boride, $TiB_2$, $ZrB_2$, TiC, ZrC, HfC, VC, NbC, TaC, $Cr_3C_2$, $Mo_2C$, WC, a metal alkoxide, a silicon alkoxide, an alumina solution, a silica solution, and derivatives thereof.

17. The refractory container of claim 1, wherein at least the plurality of grooves are coated with at least one of a wetting enhancement layer and a corrosion resistant layer.

18. The refractory container of claim 1, wherein the plurality of grooves have a depth of at least 0.10 mm, a width of at least 1.75 mm, and an interval spacing of at least 1 mm, and wherein the plurality of grooves are coated with at least a layer comprising at least one of BN, AlN, SiN, and derivatives thereof.

19. The refractory container of claim 1 further comprising about 0.10 to 25 wt. % of at least one of a metal compound, a transition metal compound, an alkali metal compound, a rare earth metal compound of a boride, an oxide, a carbide, a nitride of, and mixtures thereof.

20. The refractory container of claim 1, where the refractory container is coated with at least one of:
   a fine powder comprising at least one of BN, AlN, $TiB_2$, TiC, ZrC, HfC, VC, NbC, TaC, $Cr_3C_2$, $Mo_2C$, WC, derivatives thereof; and
   an oxide thin film layer comprising at least one of a metal alkoxide and a silicon alkoxide.

21. The refractory container of claim 1, wherein the evaporation surface in contact with molten metal is coated with at least one of:
   a fine powder comprising at least one of BN, AlN, $TiB_2$, TiC, ZrC, HfC, VC, NbC, TaC, $Cr_3C_2$, $Mo_2C$, WC, and derivatives thereof; and
   an oxide thin film layer comprising at least one of a metal alkoxide and a silicon alkoxide.

22. The refractory container of claim 1, comprising:
   about 45 to 65 wt. % of boron nitride or aluminum nitride or a mixture thereof;
   about 35 to 65 wt. % of titanium diboride; and
   and about 0.10 to 25 wt. % of a metal compound, and/or an alkali metal compound, and/or a rare earth metal compound, and/or a transition metal compound selected from one of a boride, an oxide, a carbide, a nitride, derivatives and mixtures thereof.

23. A refractory container for evaporating metals having:
   an evaporation surface in contact with molten metal;
   the refractory container having a direction of conduction parallel to the a length axis of the refractory container;
   the refractory container having a plurality of grooves in the evaporation surface;
   the refractory container is characterized in that the plurality of grooves each having at least one of:
      a depth of at least 1.2 mm; and
      a width of at least 1.75 mm; and
   at least a portion of the evaporation surface in contact with molten metal is coated with a layer comprising boron nitrate.

24. The refractory container of claim 23, wherein the layer comprises a boron nitride paint.

25. A refractory container for evaporating metals, the container comprising:
   an evaporation surface for contacting molten metal;
   a direction of conduction parallel to a length axis of the refractor containers;
   a plurality of grooves in the evaporation surface, each of the plurality of grooves having a cross-sectional area of at least 0.5 $mm^2$, and where an interval spacing between each of the plurality of grooves is at least 3.5 mm; and
   at least two of the grooves have at least 20% of length at an angle of 10 to 170 degrees to the direction of electrical conduction of the refractory container.

26. The refractory container of claim 25, wherein each of the plurality of grooves has a width of at least 2.0 mm and a depth of at least 1.5 mm.

27. The refractory container of claim 25, wherein each of the plurality of grooves has a width of at least 1.0 mm and a depth of at least 0.9 mm.

28. The refractory container of claim 25, wherein each of the plurality of grooves has a depth of at least 0.10 mm.

29. The refractory container of claim 25, wherein each of the plurality of grooves has a width of at least 0.5 mm.

30. The refractory container of claim 25, wherein at least a portion of the evaporation surface is coated with a layer comprising at least one of a wetting enhancement layer and a corrosion resistant layer.

31. The refractory container of claim 30, wherein the layer comprises at least one of an oxide, a nitride, a boride, a carbide, a silicide, and derivatives thereof.

32. The refractory container of claim 31, wherein the layer is a non-electrically conductive composition comprising at least one of a boride, a carbide, a nitride, an oxide, and a silicide.

33. The refractory container of claim 32, wherein the layer comprises at least one of a transition metal, a refractory metal, a rare-earth metal, and an alkali-earth metal nitride.

34. The refractory container of claim 30, wherein the layer comprises at least one of CaO, MgO, $SiO_2$, $ZrO_2$, $B_2O_3$, $Al_2O_3$, $TiO_2$, hafnium oxide, $Y_2O_3$, YAG($Al_5Y_3O_{12}$), YAP ($AlYO_3$), YAM($Al_{12}Y_4O_7$), calcium nitride, TiN, BN AlN, $Si_3N_4$, a metal alkoxide, a silicon alkoxide, an alumina solution, a silica solution, and derivatives thereof.

35. The refractory container of claim 25, wherein the plurality of grooves are at least partially coated with a layer comprising at least one of BN, AlN, SiN, and derivatives thereof.

36. The refractory container of claim 25, further comprising:
   about 0.10 to 25 wt. % of at least one of a metal compound, a transition metal compound, an alkali metal compound, a rare earth metal compound of a boride, an oxide, a carbide, and a nitride.

37. The refractory container of claim 25, where the refractory container is coated with at least one of:
   a fine powder comprising at least one of BN, AlN, $TiB_2$, TiC, ZrC, HfC, VC, NbC, TaC, $Cr_3C_2$, $Mo_2C$, WC, and derivatives thereof; and
   an oxide thin film layer comprising at least one of a metal alkoxide and a silicon alkoxide.

38. The refractory container of claim 25, wherein the evaporation surface is coated with at least one of:
   a fine powder comprising at least one of BN, AlN, $TiB_2$, TiC, ZrC, HfC, VC, NbC, TaC, $Cr_3C_2$, $Mo_2C$, WC, and derivatives thereof; and
   an oxide thin film layer comprising at least one of a metal alkoxide and a silicon alkoxide.

39. The refractory container of claim 25, further comprising:
   about 45 to 65 wt. % of boron nitride or aluminum nitride or a mixture thereof,
   about 35 to 65 wt. % of titanium diboride; and
   about 0.10 to 25 wt. % of a metal compound; an alkali metal compound; a rare earth metal compound; a transition metal compound selected from one of a boride, an oxide, a carbide, a nitride; and derivatives and mixtures thereof.

40. The refractory container of claim 25, wherein at least a portion of the evaporation surface is coated with a layer comprising boron nitrate.

41. The refractory container of claim 40, wherein the layer comprises a boron nitride paint.

42. The refractory container of claim 25, wherein at least two of the plurality of grooves are interconnected.

* * * * *